(12) United States Patent
Muratov et al.

(10) Patent No.: US 6,937,180 B1
(45) Date of Patent: Aug. 30, 2005

(54) CODE-CONTROLLED VOLTAGE DIVIDER

(75) Inventors: Vladimir A. Muratov, Manchester, NH (US); Wlodzimierz Wiktor, Raleigh, NC (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/896,545

(22) Filed: Jul. 22, 2004

Related U.S. Application Data

(60) Provisional application No. 60/565,774, filed on Apr. 26, 2004.

(51) Int. Cl.[7] .............................................. H03M 1/78
(52) U.S. Cl. ..................................... 341/154; 341/144
(58) Field of Search .............................. 341/154, 144; 327/291

(56) References Cited

U.S. PATENT DOCUMENTS 6,222,474 B1 * 4/2001 Fattaruso et al. ........... 341/154
6,329,860 B1 * 12/2001 Komatsu .................... 327/291
6,369,736 B2 * 4/2002 Tran et al. .................. 341/144

OTHER PUBLICATIONS

LTC 1706-82 VID Voltage Programmer for Intel VRM9.0/9.1 Datasheet (Linear Technology Corporation, 2000).

* cited by examiner

Primary Examiner—Jean Bruner Jeanglaude
(74) Attorney, Agent, or Firm—W. Daniel Swayze, Jr.; W. James Brady; Frederick J. Telecky, Jr.

(57) ABSTRACT

A code-controlled voltage divider (20) is disclosed. The voltage divider (20) includes an upper portion with a resistor (22) and a dummy switching transistors (23), which is biased to be in an on-state. A lower portion of the voltage divider (20) includes multiple parallel legs, each including a resistor (24) and a corresponding switching transistor (26) that has its gate receiving one bit of a digital control word. A decoder (30) may be provided within the voltage divider (20) to generate the digital control word from an incoming code word, for example from a central processing unit (10). The lower portion resistors (24) of the voltage divider (20) are binary-weighted, and the sizes of the corresponding switching transistors (26) are binary-weighted so that the portion of the series resistance of each parallel leg that is due to the on-resistance of the switching transistor (26) is substantially constant over all of the parallel legs. The upper resistor (22) has a resistance that is related to one of the resistors (24) in the lower portion, and the size of the dummy switching transistor (23) is similarly related to the switching transistor (26) to that resistor's switching resistor (24).

25 Claims, 3 Drawing Sheets

CODE-CONTROLLED VOLTAGE DIVIDER

CROSS-REFERENCE TO RELATED APPLICATIONS

This application claims priority, under 35 U.S.C. §119(e), of Provisional Application No. 60/565,774, filed Apr. 26, 2004.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to analog circuits including a variable voltage divider.

Despite the explosive trend toward the use of digital circuitry and digital operations in modern electronic systems, there remains a continuing need for analog circuitry in certain applications. For example, power supply controllers that control the power supply voltage applied to large scale integrated circuits, such as microprocessors and digital signal processors (DSPs), ultimately control an analog power supply voltage. Analog-to-digital converters (ADCs) remain necessary in signal acquisition functions, for example in the digitization of audio signals and in receiving network and broadband communications over hard-wired or wireless communications links. Analog circuitry also continues to be used in other control functions, such as motor control, power audio output functions, and the like.

The voltage divider is a fundamental building block in analog circuits, as it provides a desired voltage level that is derived from a power supply voltage or other higher voltage in the circuit. The simplest voltage divider arrangement, well known to even the most elementary of electrical engineering students, is the resistive voltage divider. In this circuit, the output voltage is taken from a tap at a node between two or more resistors connected in series, and is at a level corresponding to the ratio of resistances (i.e., the ratio of the resistance on one side of the tap relative to the total series resistance of the divider).

It is of course desirable to provide a voltage divider having a selectable, or variable, output voltage. Such a voltage divider can be used in real-time control applications, in tunable circuits, and in many other applications. FIG. 1 illustrates a conventional "code-controlled" voltage divider, which presents an output voltage that is selectable by the application of a digital control word (the digital "code"). In this conventional arrangement, the voltage divider includes upper resistor RREF connected between input node Vin and output node Vout. Resistors R0 through R5 are connected in parallel with one another, and in series with a respective corresponding one of switches S0 through S5, between output node Vout and ground. Each of switches S0 through S5 is controlled by a corresponding control line D0 through D5, to either connect its corresponding resistor R0 through R5 to ground (and thus into the voltage divider circuit) when closed, or to remove its corresponding resistor R0 through R5 from the circuit, when open. Typically, each switch S0 through S5 is implemented by way of an metal-oxide-semiconductor (MOS) transistor with its source-drain path connected between its corresponding resistor R0 through R5, and its gate receiving the control line D0 through D5, respectively. In this case, because transistor switches S0 through S5 operate digitally (on or off), the control lines D0 through D5 correspond to a digital control word, six bits wide in this example.

To obtain good resolution in the voltage divider ratio Vout:Vin (the voltage Vout being present at output node Vout, and the voltage Vin being present at input node Vin), the resistors R0 through R5 in the conventional code-controlled voltage divider of FIG. 1 are binary-weighted. For example, resistor R0 may have the largest resistance Rs0, with resistor R1 having a resistance R1 that is one-half of resistance Rs0, resistor R2 having a resistance of one-half of resistance Rs1, and so on. As such, the resistances Rs0 through Rs5 of resistors R0 through R5 are binary-weighted:

| Resistor | Resistance Relative to Rs0 |
|---|---|
| R0 | Rs0 |
| R1 | $Rs0/2^1$ |
| R2 | $Rs0/2^2$ |
| R3 | $Rs0/2^3$ |
| R4 | $Rs0/2^4$ |
| R5 | $Rs0/2^5$ |

As a result, the digital word corresponding to the logic levels of control lines D0 through D5 will define the combination of resistors R0 through R5 that are included in the voltage divider.

In this binary-weighted case, one can readily derive the voltage ratio Vout:Vin from the value of the digital word on control lines D0 through D5. As fundamental in the art, the voltage divider ratio is determined by:

$$\frac{V_{out}}{V_{in}} = \frac{RREF}{R_{par} + RREF} = \frac{1}{1 + \frac{RREF}{R_{par}}}$$

where resistance RREF is the resistance of resistor RREF, and where resistance $R_{par}$ is the resistance of those resistors R0 through R5 that are connected into the circuit by their respective switches S0 through S5 in response to the control word on control lines D0 through D5. For purposes of this example, the binary value of the levels on control lines D0 through D5 can be considered as a digital control word (or "code"), with control line D5 being the most significant bit, and with a "1" level on a control line D0 through D5 closing its corresponding switch S0 through S5.

The resistance of a network of parallel resistors can be readily found by considering that the conductance (i.e., the reciprocal of resistance) of a network of parallel resistors is the sum of the individual conductances. In this example, therefore:

$$\frac{1}{R_{par}} = \frac{d_5}{Rs5} + \frac{d_4}{Rs4} + \frac{d_3}{Rs3} + \frac{d_2}{Rs2} + \frac{d_1}{Rs1} + \frac{d_0}{Rs0}$$

where the values $d_5$ through $d_0$ correspond to the binary values on the respective control lines D5 through D0. Using the binary-weighting of the resistances Rs5 through Rs0 in the table, one can express the parallel conductance:

$$\frac{1}{R_{par}} = \frac{d_5 2^5}{Rs0} + \frac{d_4 2^4}{Rs0} + \frac{d_3 2^3}{Rs0} + \frac{d_2 2^2}{Rs0} + \frac{d_1 2^1}{Rs0} + \frac{d_0}{Rs0} \text{ or:}$$

$$\frac{1}{R_{par}} = \left( \frac{d_5 2^5 + d_4 2^4 + d_3 2^3 + d_2 2^2 + d_1 2^1 + d_0}{Rs0} \right) = \frac{WORD}{Rs0}$$

where the control word WORD is the binary word of the logic levels on control lines D5 through D0, namely [$d_5$ $d_4$ $d_3$ $d_2$ $d_1$ $d_0$]. Placing this relationship back into the equation for the voltage divider ratio:

$$\frac{V_{out}}{V_{in}} = \frac{1}{1 + \frac{RREF \cdot WORD}{Rs0}}$$

Accordingly, in the conventional example of the voltage divider of FIG. 1, the digital code WORD readily determines the voltage divider ratio, with the resolution of the divider ideally corresponding to the ratio of the resistance RREF to the largest resistance Rs0, and with the range of the ratio depending on the number of resistors in the lower part of the divider.

While this conventional voltage divider of FIG. 1 appears attractive for implementation into an integrated circuit, it has been observed, in connection with this invention, that practical limitations insert imprecision into this conventional circuit. One such limitation is the on-resistance presented by switches S0 through S5, which adds to the resistance in the associated parallel legs of the circuit. This additional resistance will, of course, disturb the binary weighting of the voltage divider, causing the output voltage $V_{out}$ to not correspond to the desired ratio. According to conventional techniques, the on-resistance of switches S0 through 55 can be made insignificant relative to the resistances Rs0 through Rs5, but this requires the switching transistors to be extremely large, which is impractical for implementation into an integrated circuit.

Conversely, it is possible to include the switch impedance into the design, so that the combination of each resistor R0 through R5 and the impedance of its corresponding switch S0 through S5 is accounted for in the design (e.g., by reducing the resistance of each resistor by the on-resistance of its switch). However, it has been observed, in connection with this invention, that the differences in construction between integrated circuit resistors and switching transistors, such differences including different materials, different doping levels, and the like, result in different thermal coefficients of these devices. In other words, the precision of the voltage divider circuit may not hold over expected variations in temperature.

BRIEF SUMMARY OF THE INVENTION

It is therefore an object of this invention to provide a resistor-based code-controlled voltage divider in which the effects of the impedances of the switching transistors are minimized.

It is a further object of this invention to provide such a divider that can be readily and efficiently implemented into an integrated circuit.

It is a further object of this invention to provide such a divider that can be implemented into an integrated circuit without requiring special manufacturing processes.

It is a further object of this invention to provide such a divider that is especially useful in a DC-to-DC programmable voltage controller application, such as for controlling the power supply voltage to a microprocessor.

Other objects and advantages of this invention will be apparent to those of ordinary skill in the art having reference to the following specification together with its drawings.

The present invention may be implemented into a resistor-based voltage divider, in which an upper portion includes a resistor in series with a dummy switching transistor, and in which a lower portion includes a plurality of resistors, each in series with a switching transistor. The plurality of lower resistors are of varying resistances, preferably binary-weighted, so that the control signals applied to the switching transistors correspond to a digital control word, setting the voltage divider ratio accordingly. Each of the switching transistors is sized in a weighted manner, corresponding to the weighting of its associated series resistor. The upper resistor has a resistance that is related to one of the lower parallel resistors, and the dummy switching is scaled to have a similar relationship to the switching transistor corresponding to the reference lower resistor.

DETAILED DESCRIPTION OF THE INVENTION

The present invention will be described in connection with its preferred embodiment, namely as implemented into a code-controlled voltage divider for use in a DC-to-DC voltage controller application, because it is contemplated that this invention is especially beneficial to such an for a microprocessor-based system. However, it is also contemplated that this invention will be beneficial in a wide range of applications, including those in which controllable voltage dividers are now used or may be used in the future. Accordingly, it is to be understood that the following description is provided by way of example only, and is not intended to limit the true scope of this invention as claimed.

As known in the art, modern programmable logic devices, such as microprocessors and digital signal processors (DSPs), can operate in different modes. In some cases, these different modes correspond to varying power supply voltages. For example, many modern microprocessors are able to adjust their core voltage, in real time, according to their computational workload and clock frequency. As will become evident from this description, the present invention is particularly beneficial in such an application.

Figure 2:
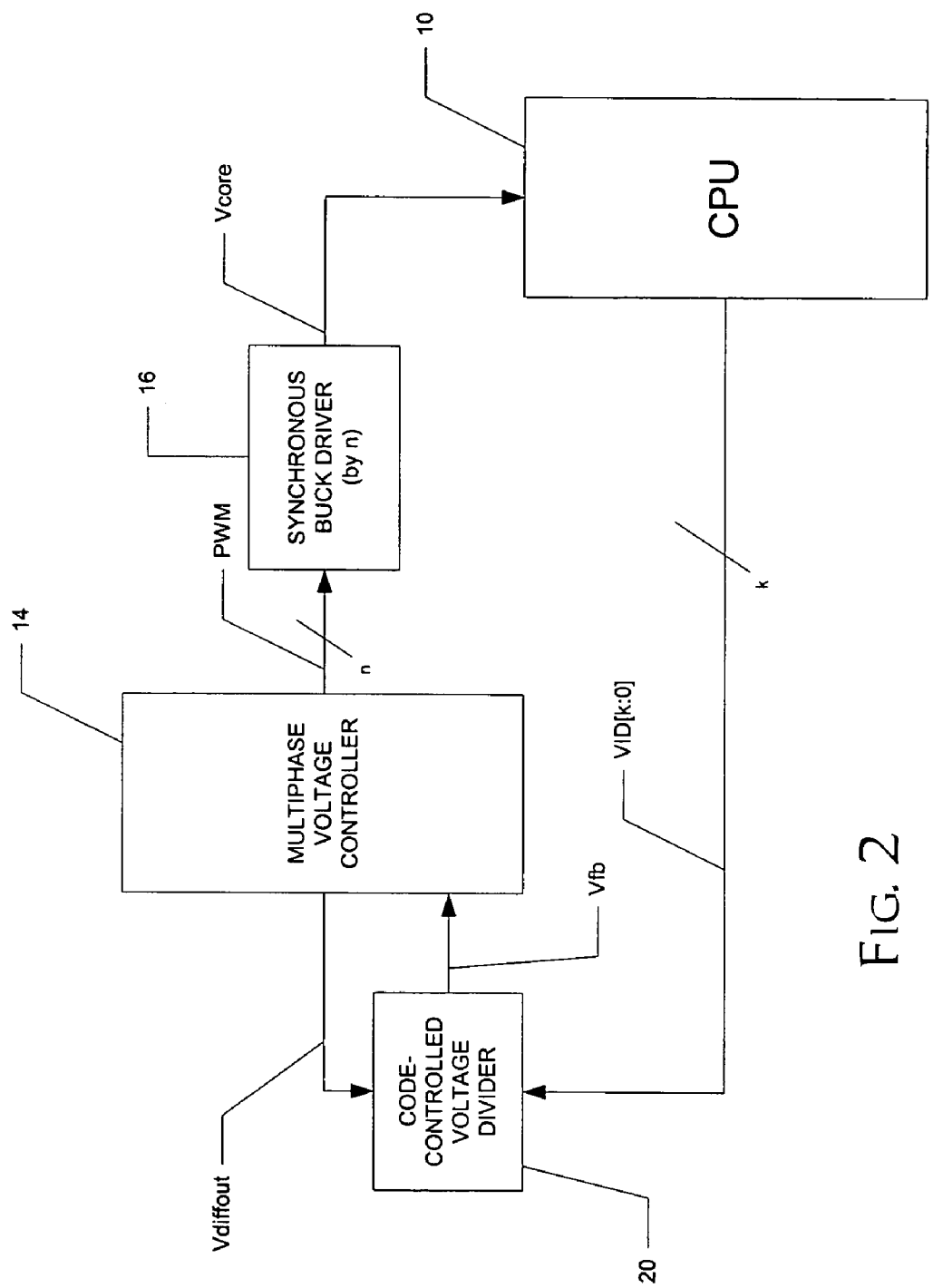
FIG. 2 is an electrical diagram, in block form, of a DC-to-DC voltage controller constructed according to the preferred embodiment of the invention.

Referring now to FIG. 2, a microprocessor-based system utilizing a code-controlled voltage divider, according to the preferred embodiment of the invention, will now be described in detail. In this system, CPU 10 is a conventional microprocessor or DSP, and as such performs sequences of digital operations under the control of software routines, as known in the art. These operations are typically executed in conjunction with external memory resources, input/output functions, control circuits, and the like, coupled to CPU 10 in the conventional manner; such circuits and functions are not illustrated in FIG. 2 for clarity, but it is of course contemplated that those skilled in the art having reference to this specification will readily comprehend this preferred embodiment of the invention and the manner in which such circuits and functions would be implemented in an actual system. CPU 10 includes, in this exemplary system, the capability of adjusting its core power supply voltage Vcore in response to its current computational workload and clock frequency. In this example, CPU 10 issues a control word (or "code"), on control lines VID[k:0], that indicates the desired core power supply voltage Vcore. These control lines VID[k:0] are connected to inputs of code-controlled voltage divider 20.

In the exemplary system of FIG. 2, core power supply voltage Vcore is generated by multiphase voltage controller 14, in combination with multiple synchronous buck drivers 16. Multiphase voltage controller 14 generates multiple pulse-width-modulated output signals (numbering n in this example) on lines PWM, which synchronously control the operation of multiple (n) buck drivers 16 in a phase-staggered manner. The outputs of buck drivers 16 are wire-ORed together to present core power supply voltage Vcore to CPU 10. An example of multiphase voltage controller 14 suitable for use in connection with this embodiment of the invention is the TPS40090 High-Frequency Multiphase Controller, available from Texas Instruments Incorporated, and which is capable of controlling from two to four external drivers (i.e., two to four phases) in presenting a desired power supply voltage. Examples of synchronous buck drivers 16 that are suitable for use in connection with this embodiment of the invention are the members of the UCC2722x family of synchronous buck drivers, also available from Texas Instruments Incorporated.

Multiphase voltage controller 14, in this system, generates its output signals on lines PWM based on a feedback voltage Vfb, which is at a fraction of output voltage Vdiffout. As known in the art from the TPS40090 controller, multiphase voltage controller 14 includes a unity gain differential amplifier, preferably with high bandwidth, that enables regulation of the eventual core power supply voltage Vcore at a user-defined voltage. The user-defined voltage, in this exemplary system, is a user-selected fraction of the output voltage Vdiffout from this differential amplifier. And according to this embodiment of the invention, this selected fraction is the voltage divider ratio Vfb:Vdiffout determined by code-controlled voltage divider 20 in response to the control word on lines VID[k:0] issued by CPU 10 itself. Accordingly, if CPU 10 wishes to increase its core power supply voltage Vcore, it issues a higher value of the control word on lines VID[k:0] to code-controlled voltage divider 20; conversely, if CPU 10 wishes to decrease core power supply voltage Vcore, it issues a lower value of the control word on lines VID[k:0] to code-controlled voltage divider 20.

Figure 3:
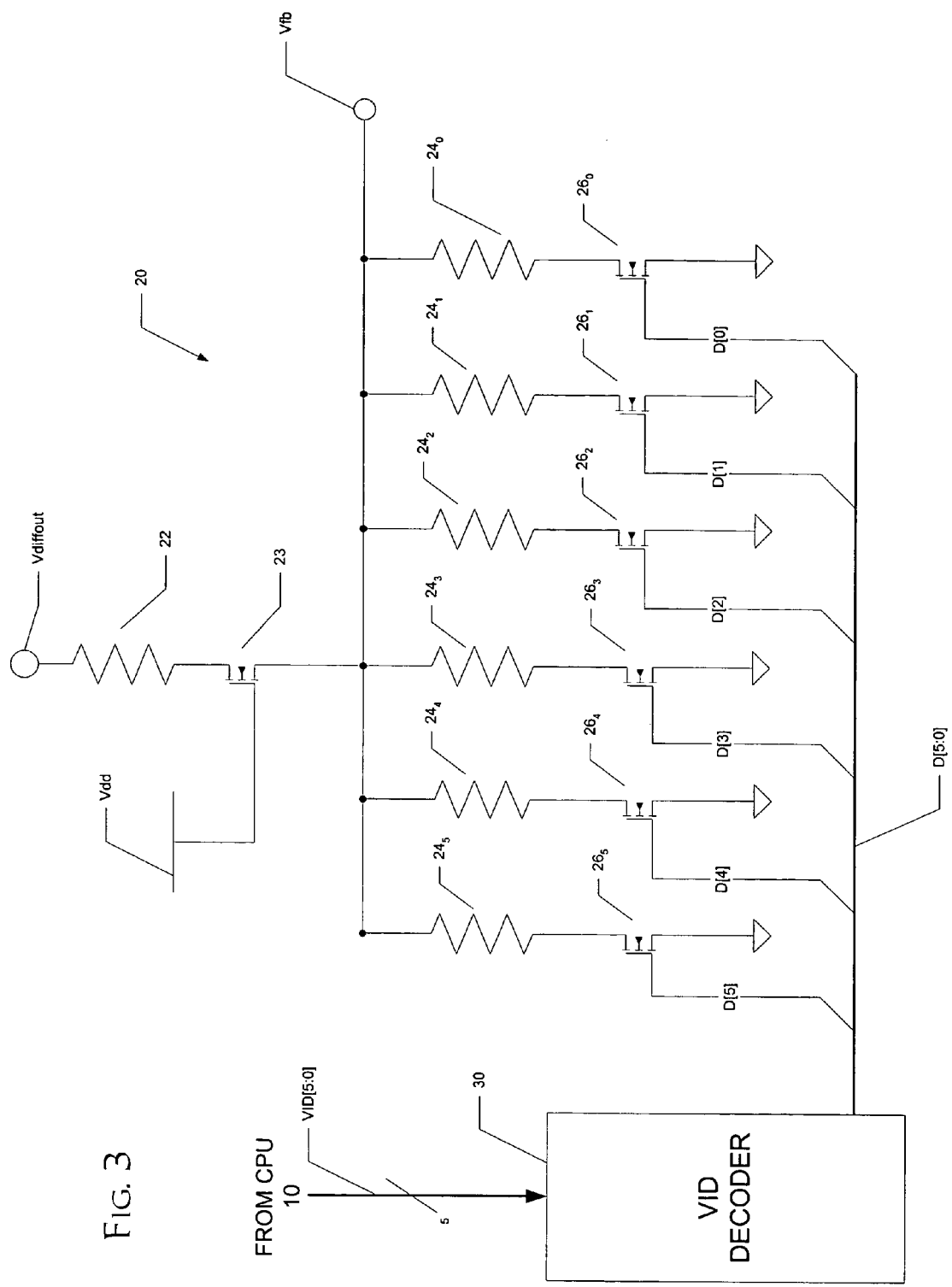
FIG. 3 is an electrical diagram, in schematic form, of a code-controlled voltage divider circuit, such as used in the voltage controller of FIG. 2, and constructed according to the preferred embodiment of the invention.

Referring now to FIG. 3, the construction of code-controlled voltage divider 20 according to the preferred embodiment of the invention, referring to its inputs and output in a manner consistent with the system of FIG. 2, will now be described. In this exemplary implementation, the input voltage Vdiffout is applied to one end of upper resistor 22. Resistor 22 is connected in series with the source-drain path of n-channel metal-oxide-semiconductor (MOS) dummy switching transistor 23, between the input node receiving voltage Vdiffout and the output node presenting voltage Vfb. In the system of FIG. 2, for example, input voltage Vdiffout is presented by multiphase voltage controller 14, and output voltage Vfb is forwarded back to multiphase voltage controller 14. The gate of MOS dummy switching transistor 23 is biased to a high voltage (e.g., power supply voltage Vdd), so that MOS dummy switching transistor 23 is always in an on-state. Resistor 22 and dummy switching transistor 23 constitute the upper portion of code-controlled voltage divider 20, in this example.

The lower portion of code-controlled voltage divider 20 in this exemplary embodiment of the invention is provided by multiple legs connected in parallel, each parallel leg including a resistor 24 connected in series with the source-drain path of a corresponding n-channel MOS transistor 26, between the output node at the source of transistor 23, and ground. In this example, six resistors $24_0$ through $24_5$ are provided, each connected to a corresponding MOS transistor $26_0$ through $26_5$, respectively. Of course, more or fewer resistors 24 and corresponding transistors 26 may be used. In this example, the gates of each of MOS transistors 26 receive a respective one of control lines D[5:0], with control line D[5] connected to the gate of transistor $26_5$, control line D[4] connected to the gate of transistor $26_4$, and so on. Transistors 23, 26 are preferably constructed similarly as one another (namely, of the same conductivity type, doping concentrations, gate electrode material, gate dielectric material and thickness, and the like), for purposes of device matching as described in further detail below.

In this example, referring back to FIG. 2, the digital code issued by CPU 10 on control lines VID[5:0] correspond to a digital code indicating the desired output voltage from code-controlled voltage divider 20, or more specifically, the desired voltage divider ratio. However, this code on lines VID[5:0] may not directly represent the digital progression from high to low voltage (or vice versa). For example, the VID codes used in connection with microprocessors available from Intel Corporation are not direct digital representations of the desired voltage, to attain backward-compatibility with older microprocessors. According to this embodiment of the invention, therefore, VID decoder 30 receives the control word from CPU 10 on lines VID[5:0] and translates this control word into the digital word applied to the gates of transistors 26 on control lines D[5:0]. VID decoder 30 may be constructed in the conventional manner for decoder circuitry, of course depending on the particular code in use. Of course, if the control code word issued by CPU 10 on control lines VID[5:0] directly translates to the desired voltage divider ratio (or if, alternatively, CPU 10 itself decodes the VID word), decoder 30 is unnecessary.

In any case, the digital word on control lines D[5:0] control the selection of which of transistors $26_5$ through $26_0$ connect their respective resistors $24_5$ through $24_0$ to ground. With MOS transistors 26 all being n-channel, a high logic level on a control line D[i] will turn on its respective MOS transistor $26_i$, and include its corresponding resistor $24_i$ in the voltage divider circuit.

Of course, MOS transistors 23 and 26 may be implemented as p-channel MOS transistors, rather than n-channel devices as shown in FIG. 3, with complementary voltages and logic levels from this example of FIG. 3. Further in the alternative, other transistor technologies (e.g., bipolar transistors) may be used to implement transistors 23, 26. As will be apparent from the following description, however, and in any case, dummy switching transistor 23 should be similarly constructed as switching transistors 26 (i.e., according to the same technology and with at least the same conductivity type, if not the same doping levels and other characteristics), for optimum precision.

Figure 1:
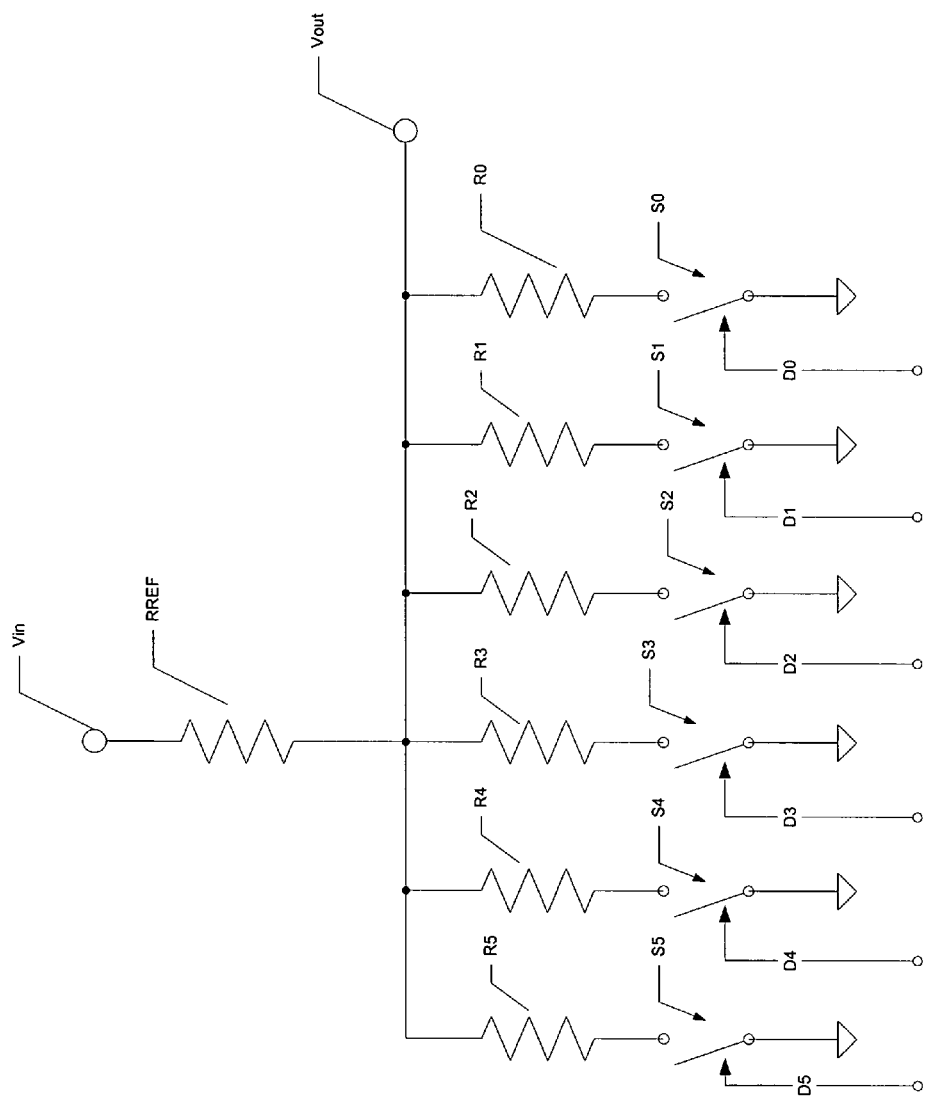
FIG. 1 is an electrical diagram, in schematic form, of a conventional code-controlled voltage divider circuit.

As in the conventional code-controlled voltage divider of FIG. 1, resistors $26_5$ through $26_0$ are preferably binary-weighted, so that the digital word presented on lines D[5:0], by CPU 10 in the example of FIG. 2, controls the voltage divider ratio Vfb:Vdiffout in a linear manner corresponding to the digital value of that word. Using the convention of control line D[5] as the most significant bit of this control word, and control line D[0] as carrying the least significant bit, this weighting of the resistances $R26_5$ through $R26_0$ of resistors $26_5$ through $26_0$ corresponds to:

| Resistor | Resistance Relative to $R24_0$ |
| --- | --- |
| $24_0$ | $R24_0$ |
| $24_1$ | $R24_0/2^1$ |
| $24_2$ | $R24_0/2^2$ |
| $24_3$ | $R24_0/2^3$ |
| $24_4$ | $R24_0/2^4$ |
| $24_5$ | $R24_0/2^5$ |

In this manner, the most significant control line D[5] determines whether the lowest resistance resistor 245 is included in the voltage division.

According to this preferred embodiment of the invention, the size of MOS transistors $26_5$ through $26_0$ are also binary-weighted. This binary weighting of transistors 26 weights the on-resistance of each of these devices in a manner corresponding to the weighting of the resistances of the corresponding resistors 24, so that transistor $26_0$ is the most resistive transistor 26 because it is associated with the resistor $24_0$ having the highest resistance, and so that transistor $26_5$ is the least resistive transistor 26 because it is associated with the resistor $24_5$ having the lowest resistance. In this way, the fraction of the combined resistance of each of the parallel lower legs of code-controlled voltage divider 20 that is due to the resistance of the switching transistor 26 is constant. Stated in another way, the ratio of the on-resistance of each switching transistor 26 to the resistance of its associated resistor 24 is substantially constant over all of the parallel legs of code-controlled voltage divider (20).

As is well known in the art, the on-resistance of an MOS transistor is directly proportional to the channel width W of the device, holding the channel length L constant. As is also well known in the art, the channel width-to-length ratio (W/L) is also a primary factor in the drive of the transistor. For the example of FIG. 3, the relationship among the channel widths $W26_5$ through $W26_0$ of MOS transistors 265 through $26_0$, respectively, assuming a constant W/L ratio, is:

| Transistor | Channel Width Relative to $W26_0$ |
| --- | --- |
| $26_0$ | $W26_0$ |
| $26_1$ | $2^1 \cdot W26_0$ |
| $26_2$ | $2^2 \cdot W26_0$ |
| $26_3$ | $2^3 \cdot W26_0$ |
| $26_4$ | $2^4 \cdot W26_0$ |
| $26_5$ | $2^5 \cdot W26_0$ |

Alternatively, the channel lengths $L26_5$ through $L26_0$ could be binary-weighted, holding channel width constant, in which case the longer channel length (and thus most resistive) transistor would be transistor $26_0$, and the shortest channel length (and thus least resistive) transistor would be transistor $26_5$.

The value of the resistance R22 of upper resistor 22 will determine the range of the output voltage Vfb, and also the incremental change of output voltage Vfb for a one-bit change in the digital word on control lines D[5:0]. In the exemplary system of FIG. 2, the selection of resistance R22 is preferably made with consideration of a reference voltage Vref upon which multiphase voltage controller 14 bases its operation. This reference voltage Vref may also bias parasitic capacitances present in code-controlled voltage divider 20 to reduces noise at the output node during to transitions between voltage divider ratios. In this implementation, resistance R22 is scaled by a ratio of the voltage step ΔV for a single bit change in the control word on control lines D[5:0] to this reference voltage Vref as follows:

$$R22 = R24_0 \left( \frac{\Delta V}{V_{ref}} \right)$$

And, according to this preferred embodiment of the invention, the size (i.e., channel width W23) of MOS transistor 23 is similarly scaled, relative to the channel width $W26_0$ of MOS transistor $26_0$:

$$W23 = W26_0 \div \left( \frac{\Delta V}{V_{ref}} \right)$$

considering that the on-resistance of a MOS transistor is inversely proportional to its channel width, holding channel length constant.

If one considers the on-resistance of switching transistors 26 to be zero (similarly as discussed above in the Background of the Invention), the voltage divider ratio of code-controlled voltage divider 20 would be expressed as:

$$\frac{Vfb}{Vdiffout} = \frac{1}{1 + \frac{R22 \cdot D[5:0]}{R24_0}}$$

where D[5:0] is the digital word on control lines D[5:0]. Considering the relationship of resistance R22 relative to resistance $R24_0$ described above, the voltage divider ratio can be expressed as:

$$\frac{Vfb}{Vdiffout} = \frac{1}{1 + \frac{\Delta V \cdot D[5:0]}{V_{ref}}} = \frac{V_{ref}}{V_{ref} + \Delta V \cdot D[5:0]}$$

But, as mentioned above, the on-resistance of switching transistors 26 is not zero. However, according to this preferred embodiment of the invention, these on-resistances are scaled with the resistances of resistors 22, 24. Accordingly, one can consider, according to this preferred embodiment of the invention, the summed resistances of each resistors 24 and the on-resistance of its transistor 26, as selected by the digital word D[5:0] and in parallel, with the resistance R22 of resistor 22 and the on-resistance of dummy switching transistor 23, to constitute the voltage divider. Accordingly, the actual voltage divider ratio of code-controlled voltage divider 20 can be derived from the basic voltage divider equation:

$$\frac{Vfb}{Vdiffout} = \frac{Z22}{Z_{par} + Z22} = \frac{1}{1 + \frac{Z22}{Z_{par}}}$$

where Z22 is the sum of resistance R22 and the on-resistance of dummy switching transistor 23, and where $Z_{par}$ is the equivalent resistance, in parallel, of the selected summed resistances R24 and the associated on-resistances of transistors 26 corresponding to the current digital word D[5:0]:

$$\frac{1}{Z_{par}} = \frac{D[5]}{Z24_5} + \frac{D[4]}{Z24_4} + \frac{D[3]}{Z24_3} + \frac{D[2]}{Z24_2} + \frac{D[1]}{Z24_1} + \frac{D[0]}{Z24_0}$$

where $Z24_k$ is the sum of the resistance $R24_k$ for resistors $24_k$ with the on-resistance of its associated MOS transistor $26_k$. Because both the resistances $R24_5$ through $R24_0$ and the on-resistances of transistors $26_5$ through $26_0$ are binary-weighted, the summed resistances $Z24_5$ through $Z24_0$ are also binary-weighted. The parallel conductance of the lower portion of code-controlled voltage divider 20, according to the preferred embodiment of the invention, is therefore:

$$\frac{1}{Z_{par}} = \frac{D[5]2^5}{Z24_0} + \frac{D[4]2^4}{Z24_0} + \frac{D[3]2^3}{Z24_0} + \frac{D[2]2^2}{Z24_0} + \frac{D[1]2^1}{Z24_0} + \frac{D[0]}{Z24_0} \text{ or:}$$

$$\frac{1}{Z_{par}} = \left(\frac{D[5]2^5 + D[4]2^4 + D[3]2^3 + D[2]2^2 + D[1]2^1 + D[0]}{Z24_0}\right) = \frac{D[5:0]}{Z24_0}$$

where the control word D[5:0] is the binary word of the logic levels on control lines D5 through D0. The voltage divider ratio of code-controlled voltage divider 20 thus becomes:

$$\frac{Vfb}{Vdiffout} = \frac{1}{1 + \frac{Z22 \cdot D[5:0]}{Z24_0}}$$

As mentioned above, the size of dummy switching transistor 23 (and thus its on-resistance) is scaled, relative to the size of the switching transistor 26 in one of the parallel legs (e.g., transistor $26_0$ in this example) by the ratio ΔV:Vref, and the resistance R22 of resistor 22 is also scaled, relative to the resistance of the resistor 24 in that same parallel leg (e.g., resistors $24_0$ in this example), by the same ratio ΔV:Vref. This results in summed resistance Z22 being scaled, relative to the summed resistance Z24 in that leg (e.g., summed resistance $Z24_0$ in this example), by that same ratio ΔV:Vref $$Z22 = R22 + R_{on}23 =$$

$$R24_0\left(\frac{\Delta V}{V_{ref}}\right) + R_{on}26_0\left(\frac{\Delta V}{V_{ref}}\right) = \left(\frac{\Delta V}{V_{ref}}\right)(R24_0 + R_{on}26_0) = \left(\frac{\Delta V}{V_{ref}}\right)Z24_0$$

where $R_{on}23$ and $R_{on}26_0$ are the on-resistances of transistors 23 and 26, respectively. The voltage divider ratio of code-controlled voltage divider 20 can now be expressed in a manner that accurately matches the case in which zero on-resistance for the transistors is assumed:

$$\frac{Vfb}{Vdiffout} = \frac{1}{1 + \frac{\Delta V \cdot D[5:0]}{V_{ref}}} = \frac{V_{ref}}{V_{ref} + \Delta V \cdot D[5:0]}$$

Those skilled in the art will recognize that this derivation of the voltage divider ratio of code-controlled 20 is independent of any relationship between the resistances of resistors 22, 24 and the on-resistances of their corresponding transistors 23, 26. Indeed, this invention provides the designer with an additional degree of freedom, in that there is no constraint on the on-resistance of the switching transistors relative to their resistors, so long as the weighting relationship of the sizes of transistors 23, 26 among themselves corresponds to the weighting relationship of the corresponding resistors 22, 24, among themselves.

The scaling of the sizes of transistors 26 according to the resistances of their associated resistors 24, and the presence of dummy switching transistors 23 and its relationship to its associated resistor 22, accounts for the on-resistances of transistors 26 in the deriving of the voltage divider ratio of code-controlled 20. According to this embodiment of the invention, therefore, transistors 26 can be constructed to a convenient size, and can have significant on-resistance without degrading the precision of code-controlled voltage divider 20. Therefore, these switching transistors 26 may be readily implemented within an integrated circuit with resistors 23. In addition, because the on-resistances of transistors 26 need not be minimized, these devices can be manufactured with conventional transistor fabrication processes (i.e., the same process as used to form other transistors in the same integrated circuit), and therefore without added cost due to additional process complexity.

In addition, dummy switching transistor 23 in the upper portion of the voltage divider, similarly constructed as switching transistors 26 in the lower portion, stabilizes the operation of code-controlled voltage divider 20 over a wide temperature range. The commonality in the construction of transistors 23, 26 amounts to equivalent thermal coefficients in their characteristics. To the extent that the characteristics of switching transistors 26 change with temperature, a compensating change occurs in dummy switching transistor 23. The effect of this compensating change by transistor 23 is in approximately the same scaled ratio, relative to the selected ones of transistors 26, as the ratio of resistance R22 to the resistances R24 in the selected parallel legs of the lower portion. As such, even though the characteristics of transistors 23, 26 have a different thermal coefficient from resistors 22, 24, the voltage divider ratio will remain substantially constant.

This temperature stability, and overall improved precision, provided by code-controlled voltage divider 20 has been observed by simulation. A conventional code-controlled voltage divider, such as that described above relative to FIG. 1, exhibited error (absolute value of the difference between output voltage Vfb and the desired voltage corresponding to the control word on control lines VID) of about 2 to 4 mV over its range at room temperature, and error approaching 10 mV for some values of the control word at high temperature (simulated 100 degrees C.), for a desired output voltage Vfb ranging from about 1.0 V to 1.8 V. Conversely, simulation of the preferred embodiment of the invention, as described above relative to FIG. 3, exhibits error of much less than 0.5 mV at both room and high temperature, for the same output voltage range.

It is therefore contemplated that this invention will be extremely beneficial in many systems, including microprocessor-based systems such as that illustrated in FIG. 2, as well as other electronic systems in which stable operation of a variable voltage divider is desirable. As discussed above, this invention can also be implemented extremely efficiently in integrated circuits using conventional process technology and design rules, requiring neither excessive chip area nor special manufacturing processes.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A code-controlled voltage divider circuit, comprising:
   an upper resistor;
   a dummy switching transistor, having a conduction path connected in series with the upper resistor between a first reference voltage and an output node, and having a control terminal biased to an on state;
   a plurality of lower resistive legs, each comprising:
      a lower resistor; and
      a switching transistor, having a conduction path connected in series with its associated lower resistor between the output node and a second reference voltage, and having a control terminal connected to a control line, for receiving a bit of a control word.

2. The circuit of claim 1, wherein the lower resistors in the plurality of lower resistive legs have varying resistances relative to one another;
   and wherein the switching transistors in the plurality of lower resistive legs each are constructed to have an on-resistance that varies, relative to one another, in a manner corresponding to the varying resistances among the associated lower resistors.

3. The circuit of claim 2, wherein a ratio, in each of the plurality of lower resistive legs, of the on-resistance of its switching transistor to the sum of the on-resistance of its switching transistor and its associated lower resistor, is substantially constant among the plurality of lower resistive legs.

4. The circuit of claim 3, wherein a ratio of the resistance of the upper resistor to a first one of the lower resistors is substantially equal to a ratio of the on-resistance of the dummy switching transistor to the on-resistance of the switching transistor in the one of the plurality of lower parallel legs with the first one of the lower resistors.

5. The circuit of claim 4, wherein the resistances of the lower transistors are binary-weighted relative to one another.

6. The circuit of claim 5, wherein each of the switching transistors has a channel length and a channel width;
   and wherein ratios of channel width to channel length of the switching transistors are binary-weighted relative to one another.

7. The circuit of claim 1, wherein the lower resistors in the plurality of lower resistive legs have varying resistances relative to one another;
   and wherein the switching transistors in the plurality of lower resistive legs each has a channel length and a channel width, wherein ratios of channel width to channel length for the switching transistors vary, relative to one another, in a manner corresponding to the varying resistances among the associated lower resistors.

8. The circuit of claim 7, wherein the resistances of the lower transistors are binary-weighted relative to one another.

9. The circuit of claim 1, further comprising:
   a decoder having an input for receiving a digital code word, and a plurality of outputs, each output coupled to the control terminal of one of the switching transistors, the decoder for presenting a pattern of output signals at its outputs corresponding to the digital code word received at its input.

10. The circuit of claim 1, wherein the dummy switching transistor and the switching transistors are metal-oxide-semiconductor transistors, having a source-drain path and a gate.

11. The circuit of claim 10, wherein the dummy switching transistor and the switching transistors are n-channel transistors;
   and wherein the gate of the dummy switching transistor is biased to a high power supply voltage.

12. A digital system, comprising:
   a central processing unit, for executing operations in response to program instructions, the central processing unit having an output presenting a digital code corresponding to a desired power supply voltage to be applied to at least a portion of the central processing unit;
   a power supply voltage controller, for generating a power supply voltage for application to the central processing unit responsive to a voltage level received at an input; and
   a code-controlled voltage divider, having an input receiving the digital code from the central processing unit, and having an output for presenting the voltage level to the power supply voltage controller, comprising:
      an upper resistor;
      a dummy switching transistor, having a conduction path connected in series with the upper resistor between a first reference voltage and an output node, and having a control terminal biased to an on state;
      a plurality of lower resistive legs, each comprising:
         a lower resistor; and
         a switching transistor, having a conduction path connected in series with its associated lower resistor between the output node and a second reference voltage, and having a control terminal connected to a control line, for receiving a bit of a control word corresponding to the digital code.

13. The system of claim 12, wherein the code-controlled voltage divider further comprises:
   a decoder having an input for receiving the digital code from the central processing unit, and having a plurality of outputs, each coupled to the control terminal of one of the switching transistors, the decoder for presenting a pattern of output signals at its outputs corresponding to the digital code word received at its input.

14. The system of claim 12, wherein the lower resistors in the plurality of lower resistive legs have varying resistances relative to one another;
   and wherein the switching transistors in the plurality of lower resistive legs each are constructed to have an on-resistance that varies, relative to one another, in a manner corresponding to the varying resistances among the associated lower resistors.

15. The system of claim 14, wherein a ratio, in each of the plurality of lower resistive legs, of the on-resistance of its switching transistor to the sum of the on-resistance of its switching transistor and its associated lower resistor, is substantially constant among the plurality of lower resistive legs.

16. The system of claim 15, wherein a ratio of the resistance of the upper resistor to a first one of the lower resistors is substantially equal to a ratio of the on-resistance of the dummy switching transistor to the on-resistance of the switching transistor in the one of the plurality of lower parallel legs with the first one of the lower resistors.

17. The system of claim 16, wherein the resistances of the lower transistors are binary-weighted relative to one another.

18. The system of claim 17, wherein each of the switching transistors has a channel length and a channel width;
and wherein ratios of channel width to channel length of the switching transistors are binary-weighted relative to one another.

19. The system of claim 12, wherein the lower resistors in the plurality of lower resistive legs have varying resistances relative to one another;
and wherein the switching transistors in the plurality of lower resistive legs each has a channel length and a channel width, wherein ratios of channel width to channel length for the switching transistors vary, relative to one another, in a manner corresponding to the varying resistances among the associated lower resistors.

20. The system of claim 19, wherein the resistances of the lower transistors are binary-weighted relative to one another.

21. The system of claim 12, wherein the dummy switching transistor and the switching transistors are metal-oxide-semiconductor transistors, having a source-drain path and a gate.

22. The system of claim 21, wherein the dummy switching transistor and the switching transistors are n-channel transistors;
and wherein the gate of the dummy switching transistor is biased to a high power supply voltage.

23. The system of claim 12, further comprising:
a first synchronous driver, having an input coupled to a first output of the power supply voltage controller, for driving the power supply voltage to the central processing unit responsive to a first pulse-width-modulated control signal at a first output of the power supply voltage controller.

24. The system of claim 23, further comprising:
a second synchronous driver, having an input coupled to a second output of the power supply voltage controller, for driving the power supply voltage to the central processing unit responsive to a second pulse-width-modulated control signal at a second output of the power supply voltage controller;
wherein the second pulse-width-modulated control signal is out of phase with the first pulse-width-modulated control signal.

25. The system of claim 12, wherein the power supply voltage controller presents the first reference voltage to the code-controlled voltage divider.

* * * * *